United States Patent [19]

Galburt

[11] Patent Number: 4,506,204

[45] Date of Patent: Mar. 19, 1985

[54] ELECTRO-MAGNETIC APPARATUS

[75] Inventor: Daniel Galburt, Norwalk, Conn.

[73] Assignee: The Perkin-Elmer Corporation, Norwalk, Conn.

[21] Appl. No.: 502,993

[22] Filed: Jun. 10, 1983

[51] Int. Cl.³ .............................................. G05B 1/06
[52] U.S. Cl. .................... 318/653; 355/133; 269/58; 318/38; 318/135; 318/640
[58] Field of Search ................. 355/72, 133; 335/222, 335/223; 318/640, 653, 687, 135, 162, 38; 269/58, 73; 310/12, 13

[56] References Cited

U.S. PATENT DOCUMENTS

| Re. 27,289 | 2/1972 | Sawyer | 318/135 X |
| Re. 27,436 | 7/1972 | Sawyer | 318/135 X |
| 4,087,729 | 5/1978 | Yamazaki et al. | 318/640 X |

*Primary Examiner*—L. T. Hix
*Assistant Examiner*—Della J. Rutledge

*Attorney, Agent, or Firm*—Thomas P. Murphy; Edwin T. Grimes; Francis L. Masselle

[57] ABSTRACT

This invention is directed to electro-magnetic alignment apparatus, which is particularly adapted, among many other possible uses, for use in aligning the wafers in a microlithography system, said apparatus including in combination at least three magnet assemblies which are mounted in space relationship one with respect to the others, at least three coil assemblies mounted to pass through the high flux region of the magnet assemblies respectively, the width of the coil assemblies being substantially less than the width of the high flux regions respectively, a controller for controlling the flow of current through the coil assemblies respectively, a structural assembly for connecting the coil assemblies which is movable with respect to the magnet assemblies, the coil assemblies being wound with respect to each other so that by controlling the supply of current to the coils the structure assembly can be moved selectively in three degrees of freedom.

7 Claims, 3 Drawing Figures

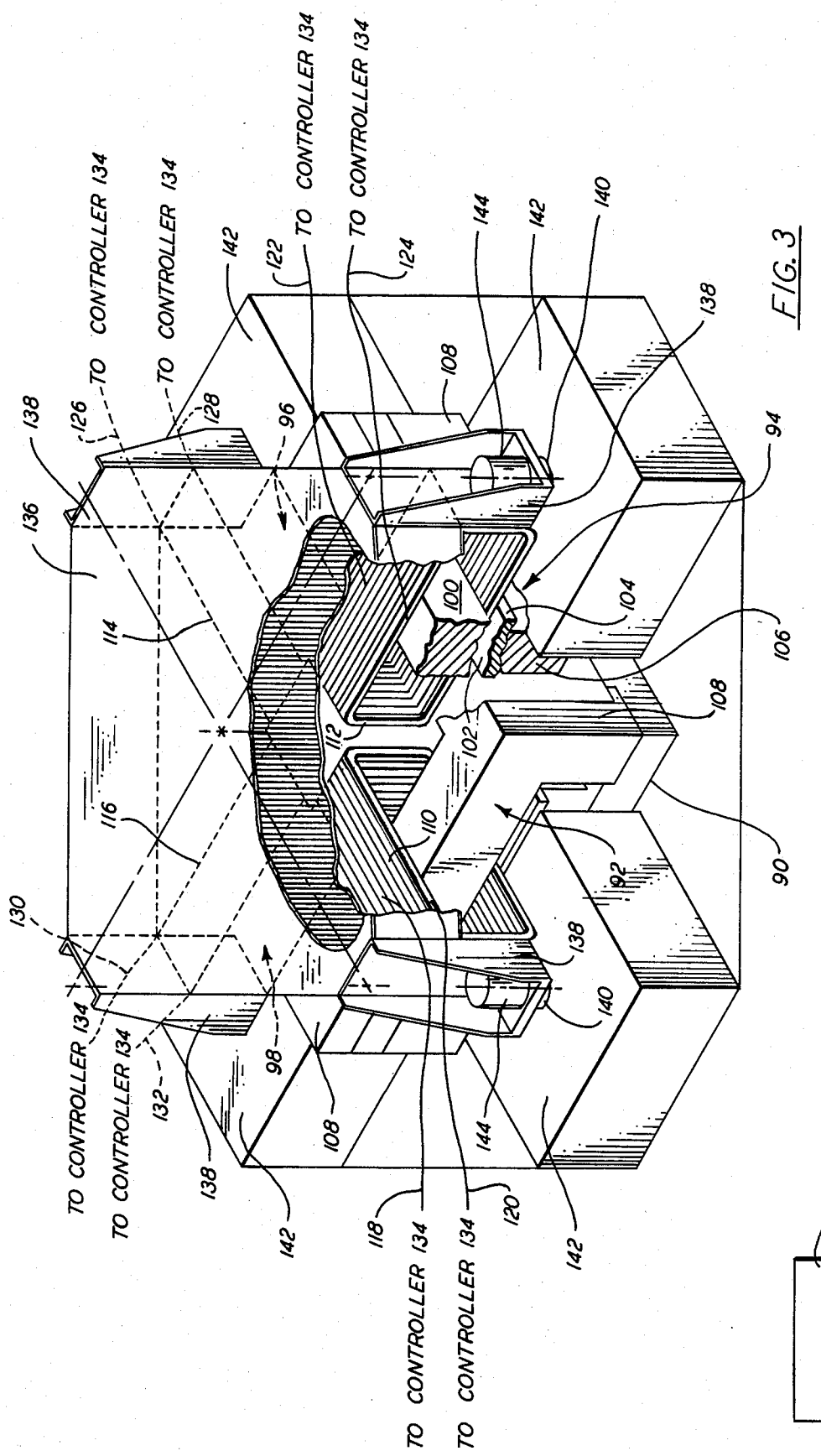

ELECTRO-MAGNETIC APPARATUS

FIELD OF INVENTION

This invention relates to apparatus and, more particularly, to electro-magnetic alignment apparatus which is particularly adapted, among many other possible uses, for use in aligning the wafer in a microlithography system.

This application is closely related to application entitled "Electro-magnetic Alignment Assemblies", filed on even day herewith and bearing Ser. No. 502,995, filed 6-10-83. This application is also closely related to patent application entitled "Electro-Magnetic Alignment Apparatus", filed on even day herewith and bearing Ser. No. 502,998 filed 6-10-83. The disclosures in said two applications are incorporated in the present specification by reference.

BACKGROUND OF THE INVENTION

Heretofore, it was thought necessary to employ three individual linear and/or rotary motors, each driving a single axis stage with the stages stacked on top of each other, in order to move an object in the three degrees of freedom defined by planar motion.

Such systems have been in operation for many years and have enjoyed reasonable success. My contribution to the art is a new type of alignment apparatus, which is an improvement over such known systems.

SUMMARY OF THE INVENTION

In brief, the present invention comtemplates a provision of an electro-magnetic alignment apparatus which is characterized by at least three magnet assemblies, and means for mounting the magnet assemblies in space relationship one with respect to the others. The apparatus is further characterized by at least three coil assemblies mounted to pass through the high flux region of the magnet assemblies respectively, the width of said coil assemblies being substantially less than the width of the high flux regions respectively, and means are provided for controlling the flow of current through the coil assemblies respectively. In addition, means are provided for connecting the coil assemblies to form a structure movable with respect to the magnets, and on which structure a silicon wafer could be mounted, for example, for use in lithographic systems. The coil assemblies are wound with respect to each other so that by controlling the supply of current to the coils the structure can be moved selectively in three degrees of freedom.

In one form of the invention, four magnet assemblies and four coil assemblies are employed. According to another aspect of the invention the high flux regions of the magnetic circuits are closed on both sides so that the coil assemblies, respectively, are included in the high flux region at all times. According to to another aspect of the invention a closed loop of wire is mounted around each side element of each magnetic circuit to minimize the inductance.

In another form of the invention four magnet assemblies are provided with means for mounting them in rectangular relationship with respect to each other, one pair of adjacent magnet assemblies being arranged so that a magnetic circuit extends from the upper plate of the first magnet to the lower plate of the first magnet to the lower pole of the second magnet to the upper pole of the second magnet and back to the upper pole of the first magnet. The other pair of adjacent magnet assemblies are arranged so that a magnetic current extends from the upper pole of the third magnet to the lower pole of the third magnet to the lower pole of the fourth magnet to the upper pole of the fifth magnet and back to the upper pole of the third magnet. This assembly also includes four coil assemblies mounted to pass through the high flux region of the magnet assemblies respectively, and the widths of the coil assemblies are substantially less that the width of the high flux regions respectively. Means are provided for controlling the flow of current through the coil assemblies and means are provided for connecting the coil assemblies to form a structure movable with respect to the magnets. The coil assemblies are wound with respect to each other so that by controlling the supply of current to said coils the structure can be moved selectively in three degrees of freedom.

There has thus been outlined rather broadly the more important features of the invention in order that the detailed description thereof that follows may be better understood, and in order that the present contribution to the art may be better appreciated. There are, of course, additional features of the invention which will be described more fully hereinafter. Those skilled in the art will appreciate that the conception on which this disclosure is based may readily be utilized as a basis for the design of other apparatus for carrying out the several purposes of the invention. It is most important, therefore, that this disclosure be regarded as including such equivalent apparatus as do not depart from the spirit and scope of the invention.

Several embodiments of the invention have been chosen for purposes of illustration and description, and are shown in the accompanying drawings, forming a part of the specification.

BRIEF DESCRIPTION OF THE DRAWINGS

FIG. 3 is a perspective view of still another embodiment of the invention.

DETAILED DESCRIPTION OF THE INVENTION

Figure 1:
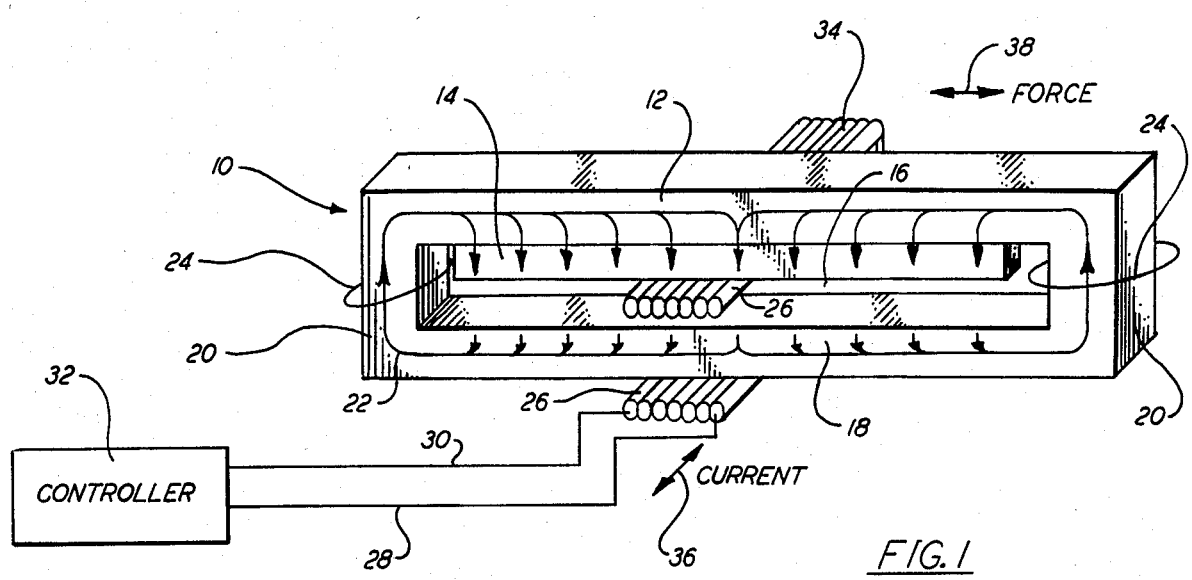
FIG. 1 is a perspective view of a portion of an electro-magnetic alignment apparatus constructed according to the concepts of the present invention.

Referring to FIG. 1, an electro-magnetic alignment apparatus is shown which includes at least three magnet assemblies, one being illustrated as they are all of similar construction. This magnet assembly is indicated at 10 in FIG. 1. It is arranged so that a magnetic circuit or flux path extends from an upper plate 12 to an upper pole piece 14, and across a gap 16 to a lower pole piece 18. The flux then splits in the middle and returns to the upper pole 12 via side or corner pieces 20 as illustrated by the line and arrows 22 in FIG. 1. A closed loop of wire 24 surrounds the corner pieces 20 to minimize inductance.

The apparatus further includes at least three coil assemblies mounted to pass through the high flux region of the magnet assemblies, respectively. Only one coil assembly 26 is illustrated because the others are of similar construction. This coil assembly passes through the high flux region 16 of the magnet assembly 10. It will be particularly appreciated that the width of the coil assembly 26 is substantially less than the width of the high flux region 16 of the magnet assembly 10. The high flux region 16 is closed on both sides as by means of the side or corner pieces 20 so that the coil assembly 26 is included in the high flux region at all times.

The coil assembly 26 is provided with leads 28 and 30. The electrical current supplied to the leads is controlled by controller 32. Means are provided for connecting the coil assemblies, only one being shown at 26, to form a structure 34 which is movable with respect to the magnet assemblies 10. An object such as a silicon wafer, for example, can be mounted on the structure 34 for use in a microlithography system. Many other possible uses of the apparatus are possible.

As shown in FIG. 1, the direction of the current flow is indicated by an arrow 36, and the magnetic circuit is indicated at 22, which results in a net force on the coils and on the structure 34 as indicated by arrow 38. As a result when three or more magnet assemblies and a like number of coil assemblies are mounted in a single plane, control of the current in the coils controls the movement of the structure 34 in three degrees of freedom, i.e., the X and Y directions, as well as the rotary motion.

Figure 2:
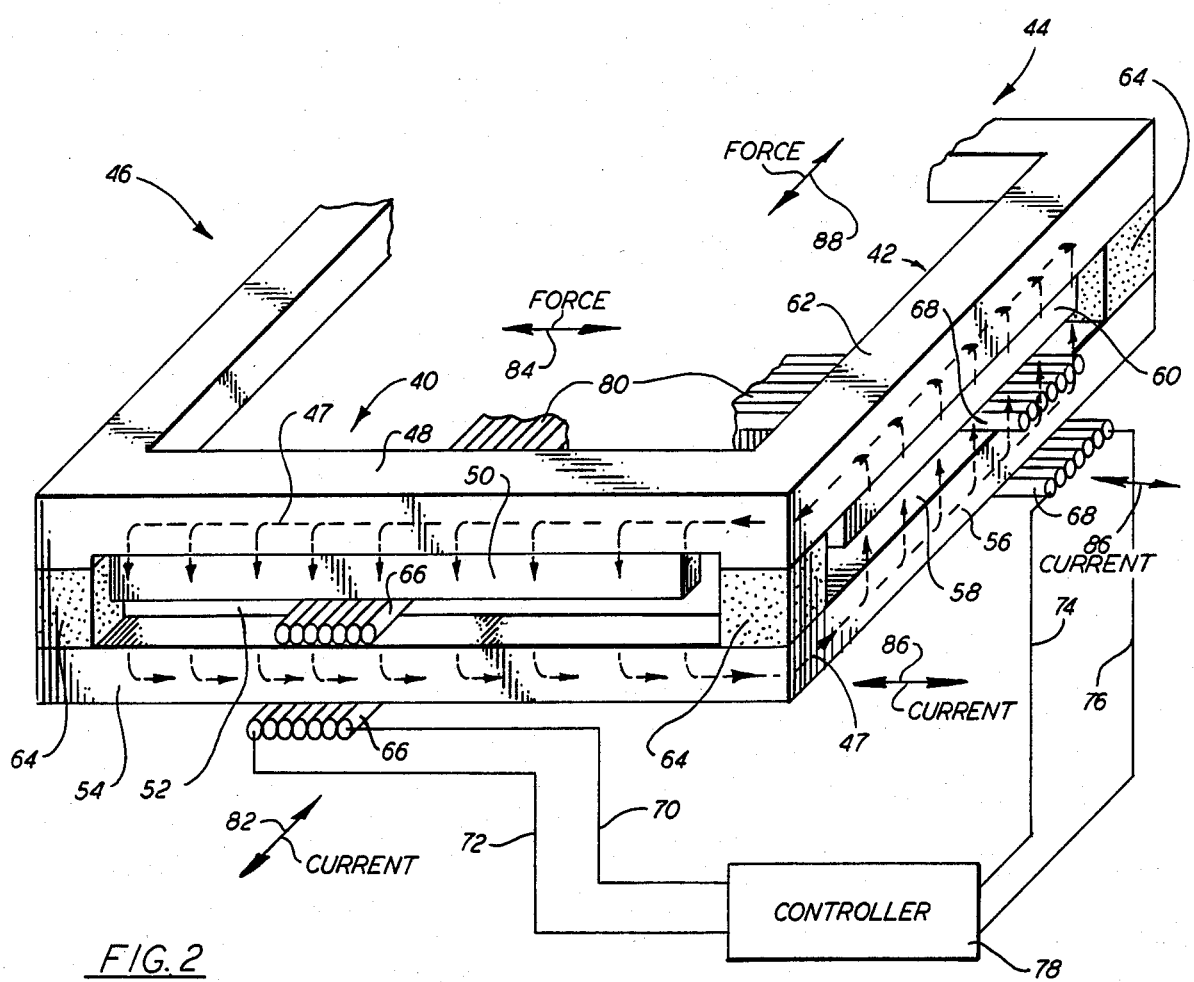
FIG. 2 is a perspective view similar to FIG. 1, but showing another embodiment of the invention.

Referring next to FIG. 2, another embodiment of an electro-magnetic alignment apparatus is shown which includes two pairs or 4 magnet assemblies, as indicated at 40, 42, 44 and 46, arranged in rectangular relationship with respect to each other. These assemblies are all in the same plane. In the adjacent pair of magnet assemblies 40 and 42, the magnets are arranged so that a magnetic circuit or flux path 47 extends from the upper pole 48 of the first magnet 40 to the upper pole piece 50 and across a gap 52 to the lower pole 54 of the first magnet and then to the lower pole 56 of the second magnet 42 and upwardly across the gap 58 to an upper pole piece 60 and then to an upper pole 62 of the second magnet 42, and then back to the upper pole 48 of the first magnet 40. The pair of magnet assemblies 44 and 46 have a magnetic ciurcuit or flux path similar to the flux path 47 just described. The corner pieces 64 provide structural support, but are fabricated from a magnetically insulating material.

Still referring to FIG. 2, the apparatus further includes four coil assemblies mounted to pass through the high flux region of the magnet assemblies, respectively. Two coil assemblies, 66 and 68, are illustrated because the other two are of similar construction. The coil assembly 66 passes through the high flux region 52 of the magnet assembly 40, and the coil assembly 68 passes through the high flux region 58 of the magnet assembly 42. It will be appreciated that the width of the coil assembly 66 is substantially less than the width of the high flux region 52 and the width of the coil assembly 68 is substantially less than the width of the high flux region 58. The high flux regions are closed on both sides by means of the side or corner pieces 64 so that the coil assemblies 66 and 68, respectively, are included in the high flux regions at all times.

The coil assembly 66 is provided with a pair of leads 70 and 72, and the coil assembly 68 is provided with a pair of leads 74 and 76. The electrical currents applied to the leads are controlled by a controller 78.

Means are provided for connecting the coil assemblies, only two being shown at 66 and 68, to form a structure 80 which is movable with respect to the magnet assemblies 40, 42, 44 and 46. An object such as a silicon wafer, for example, can be mounted on the structure 80 for use in a microlithography system. Many other possible uses of the apparatus are possible.

Still referring to FIG. 2, the direction of current flow in the first coil assembly 66 is indicated by an arrow 82, and the magnetic circuit is indicated at 47, which results in a net force on the coils and on the structure 80, as indicated by an arrow 84. The direction of current flow in the second coil assembly 68 is indicated by an arrow 86, and the magnetic circuit is indicated at 47, which results in a net force on the coils and on the structure 80, as indicated by an arrow 88. As a result, control of the current in the coil assemblies 66 and 68, as well as in the two coil assemblies not shown, serves to control the forces 84 and 88 as well as the two forces not shown to thereby control the movement of the structure 80 in three degrees of freedom, i.e., X and Y directions, as well as rotary motion.

Next, referring to the embodiment of the invention shown in FIG. 3, mounted on a ferromagnetic base 90 are four magnet assemblies mounted in a plane in rectangular relationship with respect to each other, as indicated generally at 92, 94, 96 and 98. These four assemblies are of similar construction. Each magnet assembly is arranged so that a magnetic circuit or flux path extends from an upper pole piece 100 down through a high flux region or gap 102 to a lower pole piece 104 and thence to a magnet 106. The flux then splits in the middle and returns to the upper pole piece 100 via side or corner pieces 108 in a manner similar to that described in connection with the embodiment of FIG. 1.

The apparatus further includes four coil assemblies, 110, 112, 114 and 116 mounted to pass through the high flux region of the magnet assemblies 92, 94, 96 and 98 respectively. Thus, the coil assembly 112 is mounted to pass through the high flux gap 102 the magnet assembly 94. Again, it will be particularly appreciated that the width of the coil assemblies are substantially less than the width of the high flux regions of the magnet assemblies, respectively. Each of the high flux regions, such as the one illustrated at 102 are closed on both sides as by means of the side or corner pieces 108 so that the coil assemblies such as coil assembly 112 is included in the high flux region at all times.

The coil assembly 110 is provided with leads 118 and 120, and the coil assembly 112 is provided with leads 122 and 124. In like manner the coil assembly 114 has leads 126 and 128, while the coil assembly 116 has leads 130 and 132. The electrical current supplied to the leads is controlled by a controller 134.

Means are provided for connecting the coil assemblies together to form a structure or working platform 136. The working platform is rigidly mounted on four mounting brackets 138. The four coil assemblies 110, 112, 114 and 116 are also rigidly mounted on the brackets 138 to thereby form a rigid structure which is movable as a single unit. An object such as a silicon wafer, for example, can be mounted on this working platform. However, many other possible uses of the apparatus are possible. Each bracket 138 carries an air pad 140, only two being shown, which are adapted to move on an air pad surface 142 in a very low friction manner. Height and leveling actuators 144 serve to level and adjust the height of the air pads and, hence, the working platform with respect to the magnet assemblies, respectively.

In operation, under control of the controller 134, the direction and flow of the current to the various coil assemblies in the magnetic fields produce forces on the coils themselves and, hence, on the working platform to thereby control the movement of the platform with respect to the fixedly mounted magnet assemblies. This provides three degrees of freedom, i.e., the X and Y directions, as well as the rotary motion.

It will thus be seen that the present invention does indeed provide an improve electro-magnetic alignment apparatus, which has large force capability, low power dissipation, low moving mass, extended range and movement in a plane, and which is a brushless DC device.

Although certain particular embodiments of the invention are herein disclosed for purposes of explanation, further modifications thereof, after study of this specification, will be apparent to those skilled in the art to which the invention pertains. Reference should accordingly be had to the appended claims in determining the scope of the invention.

What is claimed is:

1. A commutatorless electro-magnetic alignment apparatus comprising, in combination:
    at least three magnet assemblies, means for mounting said magnet assemblies in spaced relationship one with respect to the others;
    at least three coil assemblies mounted to pass through the high flux region of the magnet assemblies respectively, the width of said coil assemblies being substantially less than the width of said high flux regions respectively, means for controlling the flow of current through said coil assemblies respectively;
    means for connecting the coil assemblies to form a single structure which is rigid in the plane of motion and movable with respect to said magnet assemblies;
    said coil assemblies being wound with respect to each other so that by controlling the supply of current to said coils said structure can be moved selectively in three degrees of freedom.

2. An electro-magnetic alignment apparatus according to claim 1 wherein there are four magnet assemblies and four coil assemblies disposed substantially in a single plane.

3. An electro-magnetic alignment apparatus according to claim 1 wherein the high flux regions of the magnetic circuits are closed on both sides so that said coil assemblies, respectively, are included in the high flux region at all times.

4. An electro-magnetic alignment apparatus according to claim 3 further comprising a closed loop of wire mounted around each side piece of each magnetic circuit to minimize inductance.

5. An electro-magnetic alignment apparatus according to claim 2 wherein said magnet assemblies are mounted in rectangular relationship with respect to each other and adjacent magnet assemblies are connected to each other at the corners of the rectangle, each magnet assembly is arranged so that a magnetic circuit extends from the upper pole to the lower pole to the an adjacent corner piece and returns up the corner piece back to the upper pole.

6. An electro-magnetic alignment apparatus comprising, in combination:
    four magnet assemblies, means for mounting said magnet assemblies substantially in a plane in spaced relationship one with respect to the others, said magnet assemblies being in rectangular relationship with respect to each other and adjacent magnet assemblies being connected to each other by corner pieces at the corners of the rectangle, each magnet assembly being arranged so that a magnetic circuit extends from the upper pole to the lower pole to the adjacent corner piece and returns up the corner piece back to the upper pole;
    four coil assemblies mounted to pass through the high flux region of the magnet assemblies respectively, the width of the coil assemblies being substantially less than the width of the high flux regions respectfully, means for controlling the flow of current through said coil assemblies respectively;
    means for connecting the coil assemblies to form a structure movable with respect to said magnet assemblies, said means including four mounting brackets for carrying said four coil assemblies respectively, a working platform rigidly mounted on said four mounting brackets, each mounting bracket carrying an air pad for mounting on an air pad surface, each mounting bracket carrying height and leveling actuators for controlling the inclination and height of the structure; p1 said coil assemblies being wound with respect to each other so that by controlling the supply of current to said coils said structure can be moved selectively in three degrees of freedom.

7. An electro-magnetic alignment apparatus comprising, in combination;
    four magnet assemblies, means for mounting said magnet assemblies in rectangular relationship with respect to each other, one pair of adjacent magnet assemblies being arranged so that a magnetic circuit extends from the upper pole of the first magnet to the lower pole of the first magnet to the lower pole of the second magnet to the upper pole of the second magnet and back to the upper pole of the first magnet, the other pair of adjacent magnet assemblies being arranged so that a magnetic circuit extends from the upper pole of the third magnet to the lower pole of the third magnet to the lower pole of the fourth magnet to the upper pole of the fourth magnet and back to the upper pole of the third magnet;
    four coil assemblies mounted to pass through the high flux region of the magnet assemblies respectively, the width of said coil assemblies being substantially less than the width of said high flux regions respectively, means for controlling the flow of current through said coil assemblies respectively;
    means for connecting the coil assemblies to form a structure movable with respect to said magnet assemblies;
    said coil assemblies being wound with respect to each other so that by controlling the supply of current to said coils said structure can be moved selectively in three degrees of freedom.

* * * * *